United States Patent
Sun et al.

(10) Patent No.: US 8,689,092 B2
(45) Date of Patent: Apr. 1, 2014

(54) FAMILY OF LDPC CODES FOR VIDEO BROADCASTING APPLICATIONS

(75) Inventors: Fengwen Sun, Germantown, MD (US); Ming Yang, Beijing (CN); Juntan Zhang, North Potomac, MD (US); Yuhai Shi, Beijing (CN)

(73) Assignee: Availink, Inc., Germantown, MD (US)

( * ) Notice: Subject to any disclaimer, the term of this patent is extended or adjusted under 35 U.S.C. 154(b) by 970 days.

(21) Appl. No.: 11/813,206

(22) PCT Filed: Sep. 18, 2006
(Under 37 CFR 1.47)

(86) PCT No.: PCT/CN2006/002420
§ 371 (c)(1),
(2), (4) Date: May 17, 2010

(87) PCT Pub. No.: WO2008/034285
PCT Pub. Date: Mar. 27, 2008

(65) Prior Publication Data
US 2011/0307754 A1    Dec. 15, 2011

(51) Int. Cl.
*G06F 11/00* (2006.01)
*H03M 13/00* (2006.01)

(52) U.S. Cl.
USPC .......................................................... 714/800

(58) Field of Classification Search
USPC .................................. 714/746, 786, 800–801
See application file for complete search history.

(56) References Cited

U.S. PATENT DOCUMENTS

| | | | |
|---|---|---|---|
| 7,502,987 B2 * | 3/2009 | Kyung et al. | 714/781 |
| 7,747,934 B2 * | 6/2010 | Livshitz | 714/800 |
| 7,752,520 B2 * | 7/2010 | Xia | 714/752 |
| 2005/0058229 A1 | 3/2005 | Alagha | |
| 2005/0066262 A1 | 3/2005 | Eroz et al. | |
| 2005/0089068 A1 | 4/2005 | Sun et al. | |
| 2005/0091565 A1 | 4/2005 | Eroz et al. | |
| 2005/0123073 A1 | 6/2005 | Ginesi et al. | |
| 2005/0138519 A1 | 6/2005 | Boutillon et al. | |
| 2005/0180534 A1 | 8/2005 | Brotje et al. | |
| 2005/0229090 A1 | 10/2005 | Shen et al. | |
| 2006/0013333 A1 | 1/2006 | Chen | |
| 2006/0015791 A1 | 1/2006 | Kikuchi et al. | |

(Continued)

FOREIGN PATENT DOCUMENTS

| CN | 1625058 | 6/2005 |
|---|---|---|
| DE | 10134764 | 1/2003 |

(Continued)

OTHER PUBLICATIONS

"Near optimum universal belief propagation based decoding of low-density parity check codes", source(s): Jinghu Chen; Fossorier, M.P. C.; Communications, IEEE Transactions on vol. 50, Issue 3, Mar. 2002 pp. 406-414 Digital Object Identifier 10.1109/26.990903.

(Continued)

*Primary Examiner* — Shelly A Chase
(74) *Attorney, Agent, or Firm* — Greenblum & Bernstein, P.L.C.

(57) ABSTRACT

A family of quasi cyclic irregular low density parity check codes for video broadcasting applications. The parity check matrices of the constructed low density parity check codes have quasi-cyclic structures to facilitate hardware implementation and have proper check/bit degree distributions to offer frame error rate performance lower than $10^{-7}$.

9 Claims, 9 Drawing Sheets

(56) References Cited

U.S. PATENT DOCUMENTS

| 2006/0072684 A1 | 4/2006 | Feher |
| 2006/0085720 A1 | 4/2006 | Tran et al. |
| 2006/0115027 A1 | 6/2006 | Srebranig |

FOREIGN PATENT DOCUMENTS

| JP | 2000078116 | 3/2000 |
| JP | 60206284 | 10/2005 |
| KR | 2002001039 | 1/2002 |

OTHER PUBLICATIONS

"A variable-rate QPSK demodulator for digital satellite TV reception", source(s): Karam, G. (Soc. Anonyme de Telecommun., France); Paxal, C.; Sari, H. Source: IBC 94. International Broadcasting Convention (Conf. Publ. No. 397), 1994, p. 646-50.

"DVB-S2, the second generation standard for satellite broadcasting and unicasting", source(s): Morello, A. (Development Centre RAI, Italy); Reimers, U. Source: International Journal of Satellite Communications and Networking, v 22, n 3, May-Jun. 2004, p. 249-68

"COMETS 21-GHz advanced satellite broadcasting experiments-evaluation of trellis-coded 8-PSK performance", source(s): Ohkawa, M.; Takahashi, T.; Huan-Bang Li; Iigusa, K.; Wakana, H.; Broadcasting, IEEE Transactions on vol. 46, Issue 2, Jun. 2000 pp. 144-151 Digital Object Identifier 10.1109/11.868930.

"Encapsulation and framing efficiency of DVB-S2 satellite systems", source(s): Castro, M.A.V.; Cardoso, A.; Rinaldo, R.; Vehicular Technology Conference, 2004. VTC 2004—Spring. 2004 IEEE 59th vol. 5, May 17-19, 2004 pp. 2896-2900 vol. 5 Digital Object Identifier 10.1109NETEC S .2004.1391454.

"Transmission system for satellite ISDB", source(s): Saito, T.; Hashimoto, A.; Minematsu, F.; Katoh, H.; Matsumura, H.; Global Telecommunications Conference, 1998. GLOBECOM 98. The Bridge to Global Integration. IEEE vol. 5, Nov. 8-12, 1998 pp. 2942-2947 vol. 5 Digital Object Identifier 10.1109/GLOCOM.1998.776613.

* cited by examiner

FIG. 5

$$H = \begin{bmatrix} 0 & 1 & 0 & 1 & 0 & 0 \\ 1 & 1 & 0 & 0 & 0 & 0 \\ 1 & 0 & 0 & 0 & 1 & 1 \\ 0 & 0 & 1 & 0 & 0 & 1 \end{bmatrix}$$

FAMILY OF LDPC CODES FOR VIDEO BROADCASTING APPLICATIONS

REFERENCE TO A COMPUTER PROGRAM LISTING APPENDIX

The instant application contains a Computer Program Listing Appendix which has been submitted in ASCII format via compact disc and is hereby incorporated by reference in its entirety. Said ASCII copy, created on Aug. 29, 2013, is named AllCodesTable.rtf, and is 316 KBytes in size.

TECHNICAL FIELD OF THE INVENTION

This invention relates generally to error-correcting codes (ECC), and more particularly to a family of low-density parity-check (LDPC) codes for video broadcasting applications.

BACKGROUND OF THE INVENTION

The growth of broadband services has been fueled by consumers' demands for greater and greater data rates to support streaming video applications. Communication service providers therefore require an infrastructure that can support high data rates in bandwidth limited systems. Unfortunately, coding schemes employed in conventional video broadcasting systems can only provide relatively low throughput. Therefore, there is a need for a video broadcasting system that uses powerful LDPC codes to support higher date rates for the same bandwidth and power, without introducing greater complexity.

A fundamental problem in the field of data storage and communication is the development of efficient error-correcting codes. The mathematical foundations of error correction were established by Shannon. The most fundamental work of Shannon is the concept of noisy channel capacity, which defines a quantity that specifies the maximum rate at which information can be reliably transmitted through the channel. This capacity is called Shannon capacity. One of the most important research areas in information and coding theory is to devise coding schemes offering performance approaching Shannon capacity with reasonable complexity. Recently, a considerable interest has grown in a class of codes known as LDPC codes due to their feasible iterative decoding complexity and near-Shannon capacity performance.

In 1993, similar iterative methods were shown to perform very well for a new class of codes known as "turbo-codes." The success of turbo-codes was partially responsible for greatly renewed interest in LDPC codes and iterative decoding methods. There has been a considerable amount of recent work to the analysis and the iterative decoding methods for both turbo-codes and LDPC codes. For instance, a special issue of the IEEE Communications Magazine was devoted to this work in August 2003 (see T. Richardson and R. Urbanke, "*The Renaissance of Gallager's Low-Density Parity Check Codes,*" IEEE Communications Magazine, vol. 41, pp. 126-131, August 2003, and C. Berrou, "*The Ten-Year-Old Turbo Codes are entering into Service,*" IEEE Communications Magazine, vol. 41, pp. 110-117, August 2003).

LDPC codes were first described by Gallager in the 1960s. LDPC codes perform remarkably close to Shannon limit. A binary (N, K) LDPC code, with a code length N and dimension K, is defined by a parity check matrix H of (N−K) rows and N columns. Most entries of the matrix H are zeros and only a small number the entries are ones, hence the matrix H is sparse. Each row of the matrix H represents a check sum, and each column represents a variable, e.g., a bit or symbol. The number of 1's in a row or a column of the parity check matrix H is called the weight of the row or the column. The LDPC codes described by Gallager are regular, i.e., the parity check matrix H has constant-weight rows and columns.

Regular LDPC codes can be extended to irregular LDPC codes, in which the weights of rows and columns vary. An irregular LDPC code is specified by degree distribution polynomials v(x) and c(x), which define the variable and check node degree distributions, respectively. More specifically, let $$v(x) = \sum_{j=1}^{d_{vmax}} v_j x^{j-1}, \qquad (1)$$

and $$c(x) = \sum_{j=1}^{d_{cmax}} c_j x^{j-1}, \qquad (2)$$

where the variables $d_{v\,max}$ and $d_{c\,max}$ are a maximum variable node degree and a check node degree, respectively, and $v_i(c_i)$ represents the fraction of edges emanating from variable (check) nodes of degree j. The bit and check nodes degree distributions of an irregular LDPC code can also be described by specifying the numbers of bit or check nodes with different degrees. For instance, an irregular LDPC code with bit node degree distribution $(b_i, b_i) = (N_i, N_i)$ contains $N_i$ and $N_i$ bit nodes with degree $b_i$ and $b_i$, respectively. While irregular LDPC codes can be more complicated to represent and/or implement, it has been shown, both theoretically and empirically, that irregular LDPC codes with properly selected degree distributions outperform regular LDPC codes. FIG. 5 illustrates a parity check matrix representation of an exemplary irregular LDPC code of codeword length six.

LDPC codes can also be represented by bipartite graphs, or Tanner graphs. In a Tanner graph, one set of nodes called variable nodes (or bit nodes) corresponds to the bits of the codeword and the other set of nodes called constraints nodes (or check nodes) corresponds the set of parity check constraints which define the LDPC code. Bit nodes and check nodes are connected by edges. A bit node and a check node are to be neighbors or adjacent if they are connected by an edge. Generally, it is assumed that a pair of nodes is connected by at most one edge.

FIG. 6 illustrates a bipartite graph (Tanner graph) representation of the irregular LDPC code illustrated in FIG. 5. The LDPC code represented by FIG. 6 is of codeword length 6 and has 4 parity checks. As shown in FIG. 5, there are totally 9 one's in the parity check matrix representation of the LDPC code. Therefore in the Tanner graph representation shown in FIG. 6, 6 bit nodes 601 are connected to 4 check nodes 602 by 9 edges 603.

LDPC codes can be decoded in various ways such as majority-logic decoding and iterative decoding. Because of the structures of their parity check matrices, LDPC codes are majority-logic decodable.

Although majority-logic decoding requires the least complexity and achieves reasonably good error performance for decoding some types of LDPC codes with relatively high column weights in their parity check matrices (e.g., Euclidean geometry LDPC and projective geometry LDPC codes), iterative decoding methods have received more attention due to their better performance versus complexity tradeoffs. Unlike majority-logic decoding, iterative decoding processes the received symbols recursively to improve the reliability of each symbol based on constraints that specify the code. In the first iteration, the iterative decoder only uses the channel output as input, and generates reliability output for each symbol. Subsequently, the output reliability measures of the decoded symbols at the end of each decoding iteration are used as inputs for the next iteration. The decoding process continues until a certain stopping condition is satisfied. Then final decisions are made based on the output reliability measures of the decoded symbols from the last iteration. According to the different properties of reliability measures used at each iteration, iterative decoding algorithms can be further divided into hard decision, soft decision and hybrid decision algorithms. The corresponding popular algorithms are iterative bit-flipping (BF), belief propagation (BP), and weighted bit-flipping (WBF) decoding, respectively. Since the BP algorithm has been proven to provide maximum likelihood decoding given that the underlying Tanner graph is acyclic, it becomes the most popular decoding method.

Belief propagation for LDPC codes is a type of message passing decoding. Messages transmitted along the edges of the graph are log-likelihood ratio (LLR) log $p_0/p_1$ associated with variable nodes corresponding to codeword bits. In this expression $p_0$ and $p_1$ denote the probability that the associated bit takes value 0 and 1, respectively. BP decoding has two steps, a horizontal step and a vertical step.

In the horizontal step, each check node $c_m$ sends to each adjacent bit $b_n$ a check-to-bit message which is calculated based on all bit-to-check messages incoming to the check $c_m$, except the one from bit $b_n$. In the vertical step, each bit node $b_n$ sends to each adjacent check node $c_m$ a bit-to-check message which is calculated based on all check-to-bit messages incoming to the bit $b_n$ except the one from check node $c_m$. These two steps are repeated until a valid codeword is found or the maximum number of iterations is reached.

Because of its remarkable performance with BP decoding, irregular LDPC codes are among the best for many applications. Various irregular LDPC codes have been accepted or are being considered for various communication and storage standards, such as DVB-S2/DAB, wireline ADSL, IEEE 802.11n, and IEEE 802.16[4][5]. While considering applying irregular LDPC codes to video broadcasting systems, one often encounters a problem related to error floor.

The error floor performance region of an LDPC decoder can be described by the error performance curve of the system. The LDPC decoder system typically exhibits a sharp decrease in error probability as the quality of the input signal improves. The resulting error performance curves are conventionally called a waterfall curve and the corresponding region is called a waterfall region. At some point, however, the decrease of error probability with input signal quality increase decreases. The resulting flat error performance curve is called the error floor. FIG. 7 illustrates an exemplary FER performance curve containing waterfall 701 and error floor regions 702 of an irregular LDPC code.

Most video broadcasting systems require a frame error rate (FER) as low as $10^{-7}$. While given codeword length of practical interest (less than 20 k) and power constraint, most irregular LDPC codes exhibit error floor higher than $10^{-6}$, which is too high for video broadcasting applications.

LDPC codes have been used in the digital video broadcasting second generation applications (DVB S2). The first generation DVBS was introduced as a standard in 1994 and is now widely used for video broadcasting throughout the world. The ECC used in DVBS is concatenated convolutional and Reed-Solomon codes which is considered not powerful enough. Therefore in 2002 DVB S2 Project called for new coding proposals which are capable of offering 30% throughput increase for the same bandwidth and power. After examining more than 7 candidates proposed by worldly renowned research labs and companies in terms of performance and hardware complexity, the committee chose a solution based on LDPC codes which provides more than 35% throughput increase with respect to DVBS. Therefore, the LDPC codes used in the DVBS2 standard are widely considered as state-of-the-art. In comparison to the LDPC codes in the DVBS2 standard, the family of LDPC codes in the present invention has two advantages. First, the codeword length of the LDPC codes in the present invention is 15360, which is much shorter than 64800, and 16200, which are the codeword lengths of the normal and the short LDPC codes in the standard DVBS2, respectively. It is well known in the ECC area that, the longer the codeword length of an LDPC code, the better the asymptotic performance the LDPC code can offer (T. Richardson, M. Shokrollahi, and R. Urbanke, "Design of capacity-approaching irregular low-density parity-check codes," IEEE Trans. Inf. Theory, vol. 47, pp. 619-637, February 2001). Nevertheless the LDPC codes in the present invention can provide similar performance as the longer LDPC codes in the DVBS2 standard. It is also known that, from the application perspective, hardware implementation favors shorter LDPC codes which cause less design trouble and less hardware cost. The second advantage is, the LDPC codes in the present invention can offer FER lower than $10^{-7}$, which is required by video broadcasting application. By contrast, the LDPC codes in the DVBS2 standard can not provide FER lower than $10^{-7}$ by themselves therefore outer BCH codes are concatenated to the LDPC codes as outer error correcting techniques to lower the error floor. It is well known in the ECC area that, the shorter the codeword length of an LDPC code, the higher the probability the LDPC code exhibits a higher error floor. Nevertheless, without any aid of concatenated codes and with much shorter codeword length, the LDPC codes in the present invention alone can provider FER lower than $10^{-7}$.

SUMMARY OF THE INVENTION

It is an object of the invention to present a family of irregular LDPC codes with different code rates and practical codeword length which can provide error performance with error floor lower than $10^{-7}$.

The present invention is directed to irregular LDPC codes of code rates ranging from 1/4 to 9/10. The techniques of the present invention are particularly well suited for video broadcasting applications.

The LDPC codes in the present invention can offer FER performance with error floor lower than $10^{-7}$, therefore they can meet the error correcting requirements of video broadcasting applications.

At the same time, with carefully selected check and bit node degree distributions and Tanner graph constructions, the LDPC codes in the present invention have good threshold which reduce transmission power for a given FER performance.

The threshold of an LDPC code is defined as the smallest SNR value at which as the codeword length tends to infinity, the bit error probability can be made arbitrarily small.

Furthermore, the quasi-cyclic structure of the LDPC codes in the present invention simplify hardware implementation.

BRIEF DESCRIPTION OF THE DRAWINGS

The present invention is illustrated by way of example, and not by way of limitation, in the figures of the corresponding drawings and in which like reference numerals refer to similar elements and in which:

FIG. 5 is a parity check matrix representation of an exemplary irregular LDPC code of codeword length six.

DETAILED DESCRIPTION OF THE INVENTION

Figure 1:
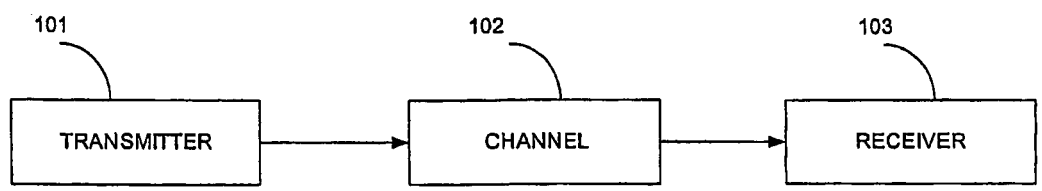
FIG. 1 is an exemplary of a communications system which employs LDPC codes.

The main purpose of ECC design is to construct LDPC codes with a good threshold to reduce transmission power consumption and to lower the error floor to provide satisfactory services. The main factors affecting threshold and error floor of irregular LDPC codes are check/bit distributions and Tanner graph structures. Steps involved in searching for optimal check/bit degree distributions of irregular LDPC codes will first be described. Next approaches of constructing preferable Tanner graphs based on given check/bit distributions will be discussed.

Given a code rate, irregular LDPC codes with different check/bit degree distributions have a different threshold. Good check/bit degree distributions can be searched through various optimization algorithms combined with density evolution. It has been shown that density evolution is an efficient theoretical tool to track the process of iterative message-passing decoding for LDPC codes. The idea of density evolution can be traced back to Gallager's results. To determine the performance of BF decoding, Gallager derived formulas to calculate the output BER for each iteration as a function of the input BER at the beginning of the iteration, and then iteratively calculated the BER at a given iteration. For a continuous alphabet, the calculation is more complex. The probability density functions (pdf's) of the belief messages exchanged between bit and check nodes need to be calculated from one iteration to another, and the average BER for each iteration can be derived based on these pdf's. In both check node processing and bit node processing, each outgoing belief message is a function of incoming belief messages. For a check node of degree $d_c$, each outgoing message U can be expressed by a function of $d_c-1$ incoming messages, $$U = F_c(V_1, V_2 \ldots V d_{c-1}),$$

where $F_c$ denotes the check node processing function which is determined from BP decoding.

Similarly, for bit node of degree $d_v$, each outgoing message V can be expressed by a function of $d_v-1$ incoming messages and the channel belief message $U_{ch}$, $$V = F_V(U_{ch}, U_1, U_2, \ldots, U d_{v-1}),$$

where $F_V$ denotes the bit node processing function. Although for both check and bit node processing, we can derive the pdf of an outgoing message based on the pdf's of incoming messages for a given decoding algorithm, there may exist an exponentially large number of possible formats of incoming messages. Therefore, the process of density evolution seems intractable. Fortunately, it has been proved in that for a given message-passing algorithm and noisy channel, if some symmetry conditions are satisfied, then the decoding BER is independent of the transmitted sequence x. That is to say, with the symmetry assumptions, the decoding BER of all-zero transmitted sequence x=1 is equal to that of any randomly chosen sequence. Thus, the derivation of density evolution can be considerably simplified. The symmetry conditions required by efficient density evolution are channel symmetry, check node symmetry, and bit node symmetry. Another assumption for the density evolution is that the Tanner graph is cyclic free. In that case, the incoming messages to any bit and check node are independent, and thus the derivation for the pdf of the outgoing messages can be considerably simplified. For many LDPC codes with practical interests, the corresponding Tanner graph contains cycles. Suppose the minimum length of a cycle (or girth) in a Tanner graph of an LDPC code is equal to 4×I, then the independence assumption does not hold after the I-th decoding iteration with the standard BP decoding. However, for a given iteration number, as the code length increases, the independence condition is satisfied for an increasing iteration number. Therefore, the density evolution predicts the asymptotic performance of an ensemble of LDPC codes and the "asymptotic" nature is in the sense of code length.

In order to keep the search for the optimal check/bit degree distributions of LDPC codes tractable, we let the number of types of bit nodes be four (except for rate 9/10 code which only has three types of bit nodes). For the purpose of constructing efficiently encodable irregular LDPC codes with good threshold, we let the number of bit nodes with degree two be $(N_s-K_s-1)\times S$, where S=32 is a constant, and $N_s=N/S$, $K_s=K/S$. For each code rate R, the message length can be calculated as K=N×R, where N=15360. Let $d_{v,x} \times S$ be the number of bit nodes with degree x. Given each R, for $d_{v,3}=1\ldots,K_s+1$ and $d_{v,4}=0,\ldots,K_s$, we can determine the number of the bit node with largest weight $d_{v,max}=K_s+1-d_{v,3}-d_{v,4}$. Then we can search for the optimal check/bit degree distributions with the smallest threshold for each $d_{v,3}$. Finally among the check/bit degree distributions associated with LDPC codes having an error floor lower than $10^{-7}$ and codeword length N=15360, we select the one with the smallest threshold. Table 1 lists the check/bit degree distributions for irregular LDPC codes with code rate 1/4, 2/5, 1/2, 3/5, 2/3, 3/4, 4/5, 5/6, 13/15, and 9/10.

TABLE 1

| bit rate | Bit node degree distributions | | | | | | |
|---|---|---|---|---|---|---|---|
| | 2 | 3 | 4 | 6 | 7 | 10 | 12 |
| 1/4 | 11264 | 256 | | 3840 | | | |
| 2/5 | 8960 | 256 | 4608 | | | | 1536 |
| 1/2 | 7424 | 2304 | 3840 | | | | 1792 |
| 3/5 | 5888 | 3328 | 4352 | | | | 1792 |
| 2/3 | 4864 | 4096 | 4864 | | | | 1536 |
| 3/4 | 3584 | 4608 | 5888 | | | | 1280 |
| 4/5 | 2816 | 5888 | 5376 | | | | 1280 |
| 5/6 | 2304 | 4608 | 6912 | | | 1536 | |
| 13/15 | 1792 | 5632 | 6912 | | 1024 | | |
| 9/10 | 1280 | 3584 | 10496 | | | | |

Given the check/bit degree distributions, an LDPC code can be constructed in several methods. These methods can be decomposed into two main classes, random or pseudorandom constructions, and algebraic constructions. Since the special structure of algebraic LDPC codes greatly facilitate the hardware implementation of decoders, we consider algebraic constructions. Algebraic constructions of LDPC codes can be further decomposed into two main categories. The first category is based on finite geometries while the second category is based on cyclic shift matrices. Because of the flexible parameters of cyclic-shift-based LDPC codes, we consider LDPC codes constructed based on circulant permutation matrices. The parity check matrix of a quasi-cyclic LDPC code is expanded from a base matrix associated with shift numbers. Given check/bit degree distributions, the ultimate performance of an LDPC code decoded by the BP algorithm mainly depends on the smallest length of loops in the corresponding Tanner graph, which is called girth. The girth of a quasi-cyclic LDPC codes is determined by the girth of the Tanner graph of the based matrix and the shift numbers. Conventionally, the Tanner graph of the base matrix first optimized based on the check/bit degree distributions, then optimal shift values are assigned to entries of the base matrix. According to a method of the invention for constructing quasi-cyclic LDPC codes, the Tanner graph of the base matrix and the shift values are optimized simultaneously.

It should be understood that the following specification may be performed or stored on a readable storage media, computer software, or hardware, such as storage tapes, RAM, ROM, flash memory, synthesized logic as is well known in the art.

In the present invention, each LDPC code is defined by a binary parity check matrix H of size (N−K)×N, which is expanded from a base matrix B of size $$\left(\frac{N-K}{32}\right) \times \left(\frac{N}{32}\right).$$

The base matrix defining (through expanded to parity check matrix) each LDPC code in the present invention is specified by the specification in the appendix. Each specification of the base matrix contains groups of numbers and each group contains 3 numbers. Each group of 3 numbers i j k specifies a non-negative entry of base matrix B, i.e, $B_{i,j}$=k. For instance, Table A of the Appendix is the specification of $B_{1/4}$ which defines the base matrix B for the rate-1/4 LDPC code and the first group 0 16 9 denotes $B_{0,16}$=9. All the entries not specified in the corresponding table are assigned with value −1. The parity check matrix H is expanded from B by replacing each non-negative entry $B_{i,j}$ with a $B_{i,j}$-right-shifted identity matrix of size 32×32, and each negative entry with an all-zero matrix of size 32×32. A $B_{i,j}$-right-shifted identity matrix is a circulant permutation matrix with a 1 at column-(r+$B_{i,j}$)mod 32 for row-r, 0≤r≤31, and zero elsewhere. All the LDPC codes in the present invention have codeword length 15360, therefore the parity check matrix H of the LDPC code with rate R contains 15360×(1−R) rows and 15360 columns.

LDPC codes in the present invention are linear block codes. Once the parity check matrix H of size (N−K)×N is specified, an LDPC code with codeword length N and dimension K is uniquely defined by H. Exchanging among any rows of parity check matrix H results in a new parity check matrix H', which is called permutation of H. The LDPC code defined by a parity check matrix H is the same LDPC code defined by the permutation of the parity check matrix H. Therefore when we refer to an LDPC code defined by a parity check matrix H, we refer to an equivalent LDPC code defined by any possible permutation of H. Besides permutation of parity check matrix H, there exists many other ways to define or describe the LDPC code defined by H. When we refer to an LDPC code defined by a parity check matrix H, we refer to an equivalent LDPC code described in any format.

FIG. 1 is a diagram of a communications system employing LDPC codes, according to an embodiment of the present invention. A communications system includes a transmitter 101 which generates signal waveforms across a communication channel 102 to a receiver 103. The transmitter 101 contains a message source producing a discrete set of possible messages and each of these messages corresponds a signal waveform. The waveforms enter the channel 102 and is corrupted by noise. LDPC codes are employed to reduce the disturbances introduced by the channel 102.

Figure 2:
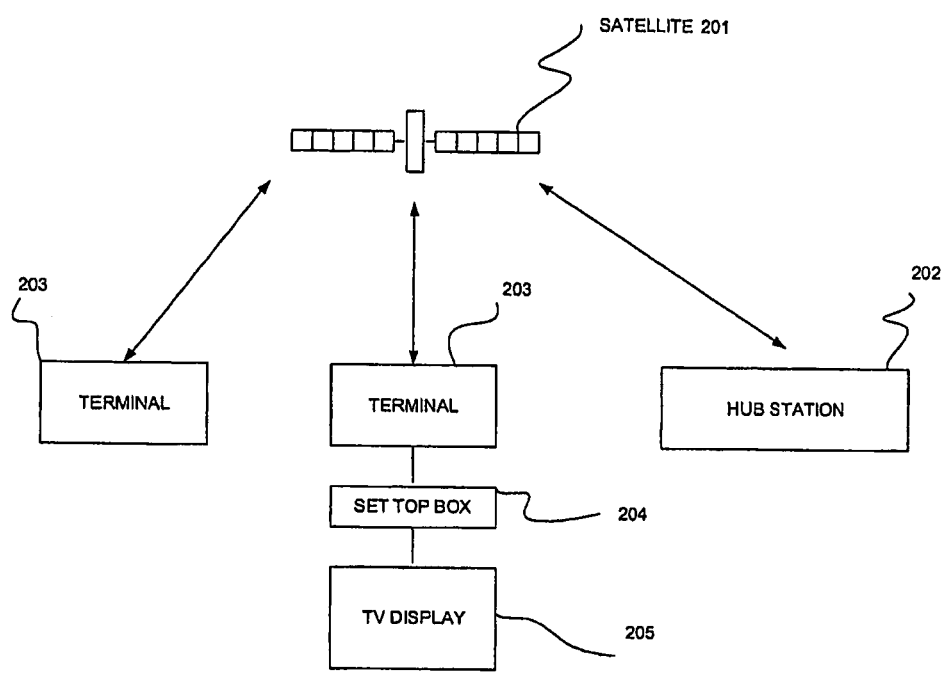
FIG. 2 illustrates an exemplary of a satellite video communications system employing LDPC codes, according to an embodiment of the present invention.

FIG. 2 depicts a diagram of a video broadcasting system using LDPC codes, according to an embodiment of the present inversion. The satellite 201 broadcasts video program from the hub station 202 to the satellite terminals 203, which may include a set top box 204 for interfacing with a television display 205. In direct video broadcasting applications, power and bandwidth efficiency are essential. In the conventional video broadcasting systems, ECC techniques such as turbo trellis coding are used to provide power and bandwidth efficiency. Nevertheless the conventional ECC techniques require higher complexity and offer low throughput given power constraint. On the contrast, LDPC codes can offer high power and bandwidth efficiency without increased complexity.

What is more, the structures of LDPC codes make them essentially suitable for parallel decoding which can greatly reduce decoding delay.

Figure 3:
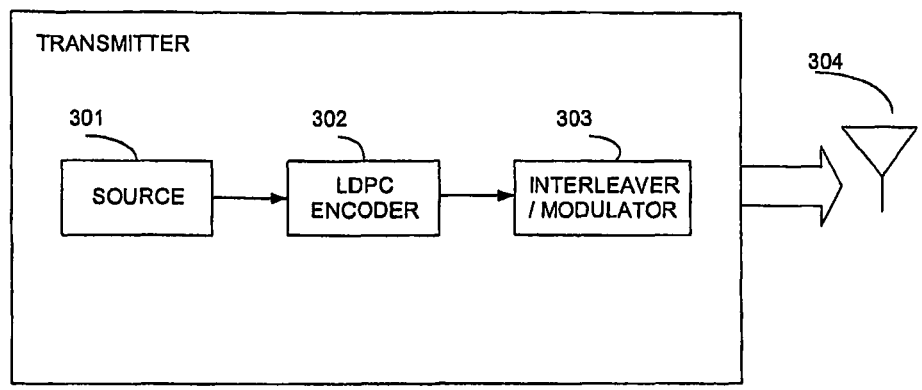
FIG. 3 illustrates an exemplary of a transmitter in FIG. 1.

FIG. 3 depicts an exemplary transmitter in the communications system of FIG. 1 which employs LDPC codes as ECC. The LDPC encoder 302 encodes information bits from source 301 into LDPC codewords. The mapping from each information block to each LDPC codeword is specified by the parity check matrix (or equivalently the generator matrix) of the LDPC code. The LDPC codeword is interleaved (for some communication systems) and modulated to signal waveforms by the interleaver/modulator 303. These signal waveforms are sent to a transmit antenna 304 and propagated to a receiver shown in FIG. 4.

Figure 4:
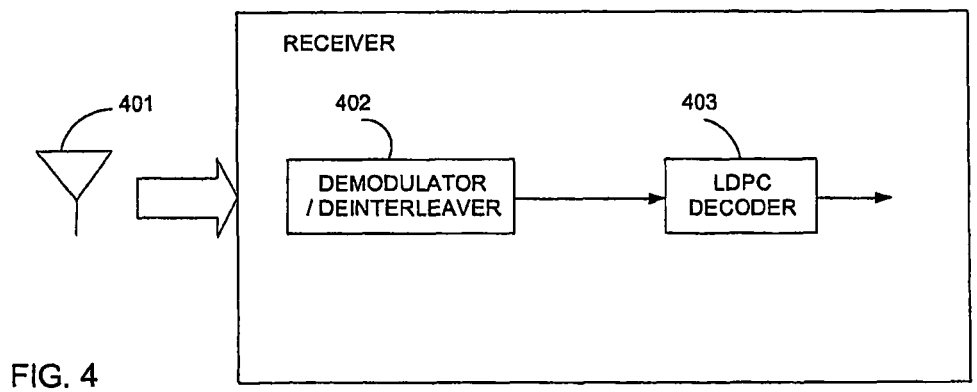
FIG. 4 illustrates an exemplary of a receiver in FIG. 1.
Figure 6:
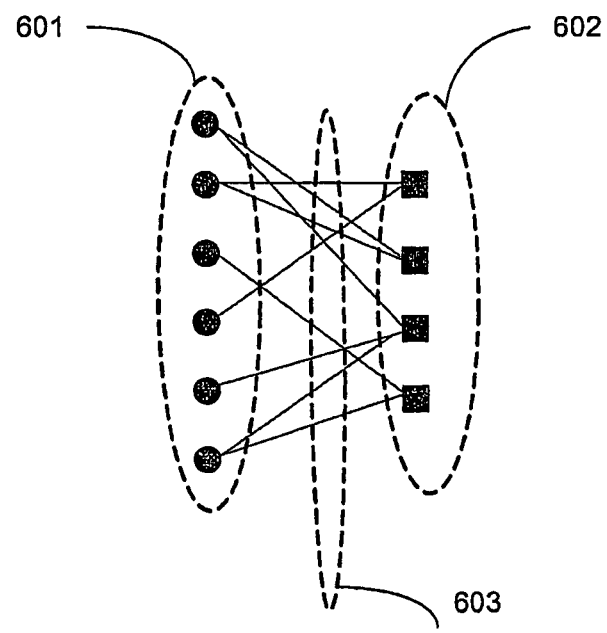
FIG. 6 illustrates a bipartite graph representation of the irregular LDPC code illustrated in FIG. 5.
Figure 7:
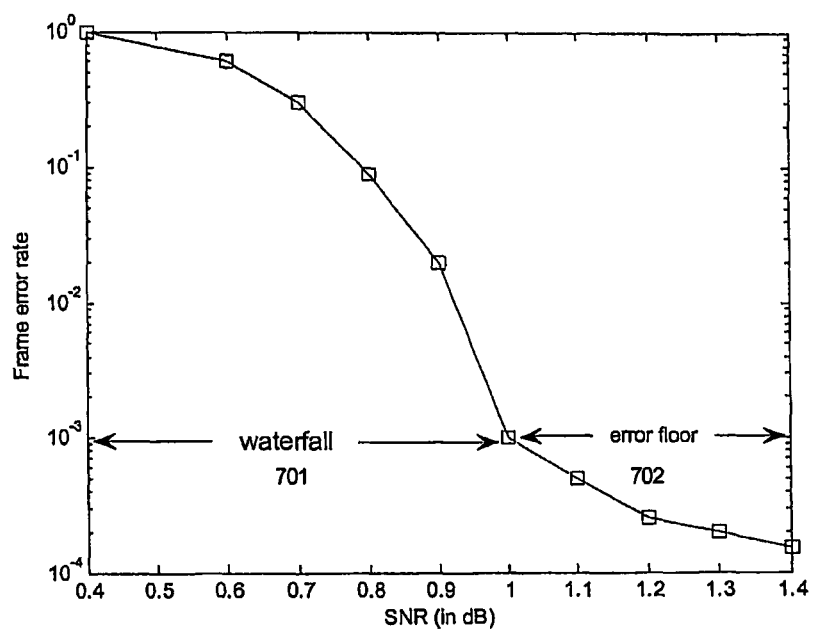
FIG. 7 illustrates an exemplary FER performance curve containing waterfall and error floor regions of an irregular LDPC code.

FIG. 4 depicts an exemplary receiver in FIG. 1 which employs LDPC codes as ECC. Signal waveforms are received by the receiving antenna 401 and distributed to demodulator/deinterleaveror 402. Signal waveforms are demodulated by demodulator and deinterleaved by deinterleavor (for some communication systems) and then distributed to a LDPC decoder 403 which iteratively decodes the received messages and output estimations of the transmitted codeword.

For most video broadcasting systems, directly transmitting an LDPC encoded and modulated signal waveforms is not acceptable, because receivers can't decode received signals without knowing where each encoded LDPC codeword starts or ends. Time references (or markers) therefore haven been necessary throughout the transmission to help identify the positions of LDPC codewords. Similarly, typical communication systems require that receiver's time and frequency be locked to a transmitter's reference, which is referred to as synchronization.

Furthermore, certain overhead information is typically periodically transferred to enable receivers to properly demodulate transmitted signals, decode signals and abstract user messages. For at least these reasons, typical transmitters insert a synchronization pattern and a header periodically into encoded messages, a process called frame formatting. Typically, a receiver first tries to lock onto a synchronization pattern and then decodes the header and message signal. Frame formatting design is critical to overall system performance and can directly impact the cost of establishing and operating a communication system. Frame formatting design often depends on many factors, such as channel characteristics, modulation type and ECC scheme. A well designed frame format may result in high performance receivers that achieve fast frame acquisition, reliable tracking (time and frequency lock) and improved ECC decoding performance (such as meeting the required FER) with minimum overhead at a low cost.

Figure 9:
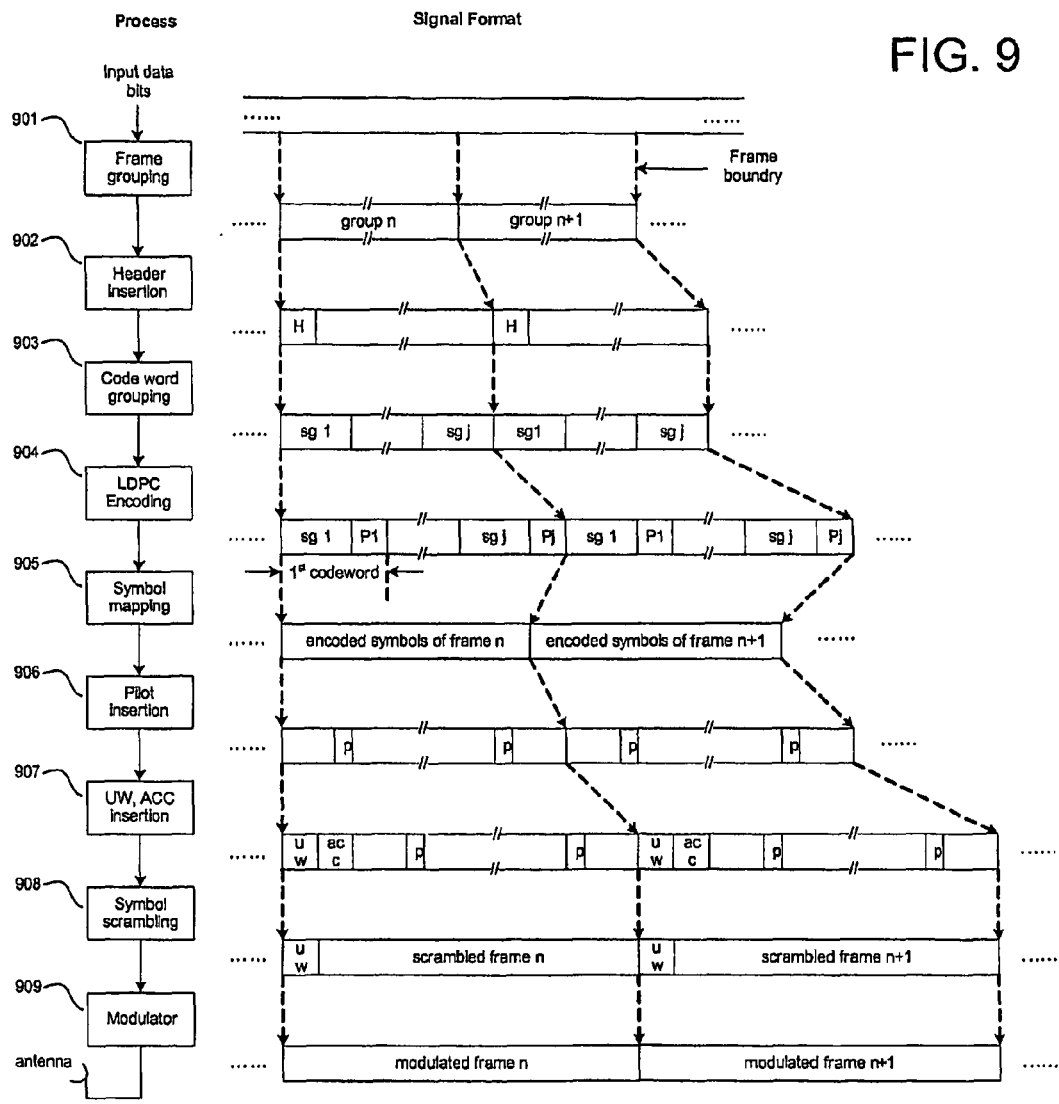
FIG. 9 illustrates an exemplary block diagram of a video broadcasting transmitter showing a framing and LDPC encoding process transforming original user data into modulated frames, according to an embodiment of the present invention.

FIG. 9 illustrates an exemplary block diagram of a video broadcasting transmitter showing a framing and LDPC encoding process transforming original user data into modulated frames, according to an embodiment of the present invention. Through a process of frame grouping 901, the input data bits to be transmitted are first divided into subsequent groups, e.g. group n and group n+1. Each group contains a number of information bits required for the corresponding frame. Each of the information groups is then prefixed by a header (H) by the header insertion module 902. The header, along with each group, is further divided into j (an integer) sub-groups (sg) by the codeword grouping module 903, with each sub-group carrying an equal number of bits. For illustration purpose, j denotes the number of sub-groups in each group. For each sub-group, in an LDPC encoding 904 process, an LDPC encoder computes the error checking and error correction parity bits (P) of a fixed length based on the sub-group's data pattern and attaches the parity bits to the end of the associated sub-group to form a code word. Then the symbol mapping module 905 maps the bit stream of each codeword into modulation symbols according to the corresponding modulation type in the codeword. Following the symbol mapping, all frames are of an equal length, regardless of modulation used. Next the pilot insertion module 906 may insert a number of pilot waves (p) evenly into the encoded frames as shown in FIG. 1. Also, the UW and ACC insertion module 907 will add a UW followed by an ACC at the beginning of each frame. The symbol scrambler 908 scrambles the symbols of each frame except the UW using a fixed scrambling pattern. Finally, all the symbols may be modulated by modulator 909 to a radio frequency for transmission through an antenna.

Figure 10:
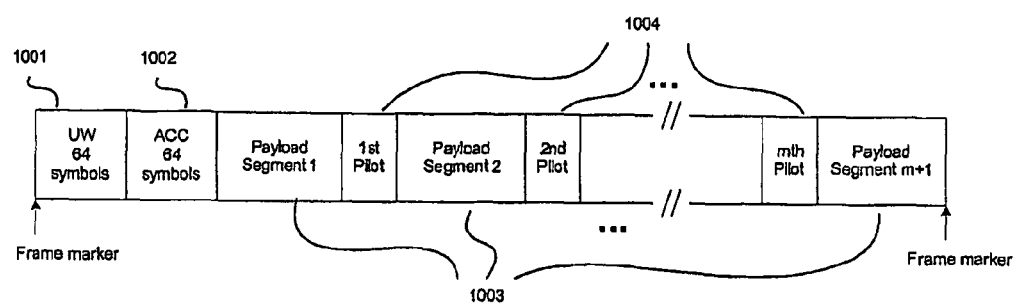
FIG. 10 illustrates an exemplary formed frame structure, according to an embodiment of the present invention.

FIG. 10 depicts an exemplary frame format of a transmitted frame containing encoded LDPC codewords according to an embodiment of the present invention. The frame starts with an 64-symbol unique word 1001, followed by 64-symbol auxiliary control code 1002, and m+1 segments 1003 of encoded LDPC data (or payload data) separated by m evenly distributed pilots 1004.

Figure 8:
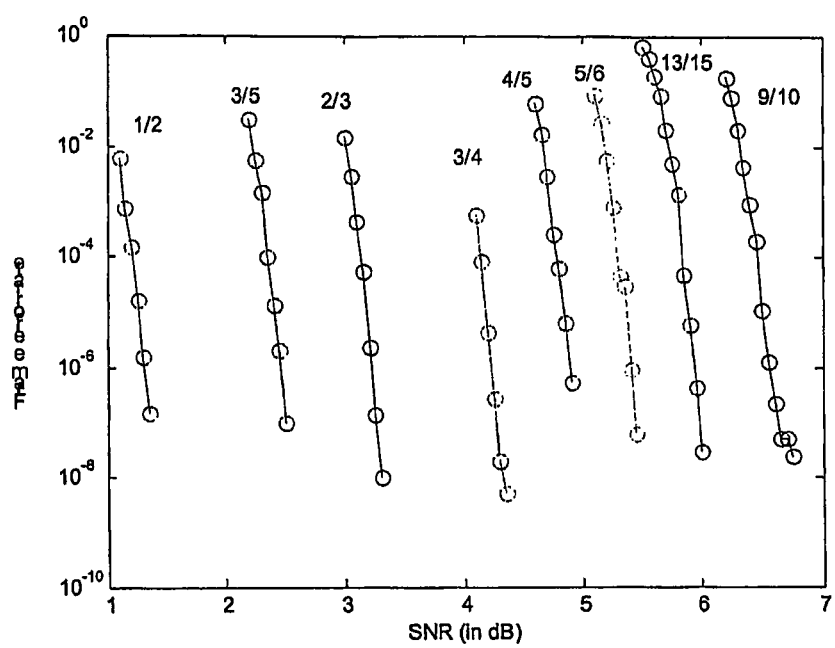
FIG. 8 illustrates the FER performance curves of the irregular LDPC codes in the present invention.

FIG. 8 depicts the performance of the family of quasi-cyclic irregular LDPC codes of code rate 1/2, 3/5, 2/3, 3/4, 4/5, 5/6, 13/15, and 9/10. From the simulation results, we observe that all codes have error floor lower than $10^{-1}$ and exhibit good threshold.

Appendix Tables A-J are specifications of the base matrices B for the code rates of 1/4, 2/5, 1/2, 3/5, 2/3, 3/4, 4/5, 5/6, 13/15, and 9/10, respectively.

Although the invention has been described by the way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A digital communications transmitter employing one or more LDPC codes selected from rates including 1/4, 2/5, 1/2, 3/5, 2/3, 3/4, 4/5, 5/6, 13/15, 9/10, wherein
the LDPC code with the rate 1/4 has a bit node degree distribution, $(b_2,b_3,b_6)=(11264,256,3840)$,
the LDPC code with the rate 2/5 has a bit node degree distribution $(b_2,b_3,b_4,b_{12})=(8960,256,4608,1536)$,
the LDPC code with the rate 1/2 has a bit node degree distribution $(b_2,b_3,b_4,b_{12})=(7424,2304,3840,1792)$,
the LDPC code with the rate 3/5 has a bit node degree distribution $(b_2,b_3,b_4,b_{12})=(5888,3328,4352,1792)$,
the LDPC code with the rate 2/3 has a bit node degree distribution $(b_2,b_3,b_4,b_{12})=(4864,4096,4864,1536)$,
the LDPC code with the rate 3/4 has a bit node degree distribution $(b_2,b_3,b_4,b_{12})=(3584,4608,5888,1280)$,
the LDPC code with the rate 4/5 has a bit node degree distribution $(b_2,b_3,b_4,b_{12})=(2816,5888,5376,1280)$,
the LDPC code with the rate 5/6 has a bit node degree distribution $(b_2,b_3,b_4,b_{10})=(2304,4608,6912,1536)$,
the LDPC code with the rate 13/15 has a bit node degree distribution $(b_2,b_3,b_4,b_7)=(1792,5632,6912,1024)$, and
the LDPC code with the rate 9/10 has a bit node degree distribution $(b_2,b_3,b_4)=(1280,3584,10496)$.

2. A digital communications transmitter employing one or more LDPC codes selected from rates including 1/4, 2/5, 1/2, 3/5, 2/3, 3/4, 4/5, 5/6, 13/15, 9/10, wherein
the LDPC code of the rate 1/4 is a rate-1/4 LDPC code defined by a parity check matrix expanded from a base matrix $B_{1/4}$,
the LDPC code of the rate 2/5 is a rate-2/5 LDPC code defined by a parity check matrix expanded from a base matrix $B_{2/5}$,
the LDPC code of the rate 1/2 is a rate-1/2 LDPC code defined by a parity check matrix expanded from a base matrix $B_{1/2}$,
the LDPC code of the rate 3/5 is a rate-3/5 LDPC code defined by a parity check matrix expanded from a base matrix $B_{3/5}$,
the LDPC code of the rate 2/3 is a rate-2/3 LDPC code defined by a parity check matrix expanded from a base matrix $B_{2/5}$,
the LDPC code of the rate 3/4 is a rate-3/4 LDPC code defined by a parity check matrix expanded from a base matrix $B_{3/4}$,
the LDPC code of the rate 4/5 is a rate-4/5 LDPC code defined by a parity check matrix expanded from a base matrix $B_{4/5}$,
the LDPC code of the rate 5/6 is a rate-5/6 LDPC code defined by a parity check matrix expanded from a base matrix $B_{5/6}$,
the LDPC code of the rate 13/15 is a rate-13/15 LDPC code defined by a parity check matrix expanded from a base matrix $B_{13/15}$, and
the LDPC code of the rate 9/10 is a rate-9/10 LDPC code defined by a parity check matrix expanded from a base matrix $B_{9/10}$.

3. A digital communications transmitter employing one or more LDPC codes selected from rates including 1/4, 2/5, 1/2, 3/5, 2/3, 3/4, 4/5, 5/6, 13/15, 9/10, wherein
the LDPC code of the rate 1/4 is a code equivalent to a rate-1/4 LDPC code defined by a parity check matrix expanded from a base matrix $B_{1/4}$, the LDPC code of the rate 2/5 is a code equivalent to a rate-2/5 LDPC code defined by a parity check matrix expanded from a base matrix $B_{2/5}$, the LDPC code of the rate 1/2 is a code equivalent to a rate-1/2 LDPC code defined by a parity check matrix expanded from a base matrix $B_{1/2}$, the LDPC code of the rate 3/5 is a code equivalent to a rate-3/5 LDPC code defined by a parity check matrix expanded from a base matrix $B_{3/5}$, the LDPC code of the rate 2/3 is a code equivalent to a rate-2/3 LDPC code defined by a parity check matrix expanded from a base matrix $B_{2/5}$, the LDPC code of the rate 3/4 is a code equivalent to a rate-3/4 LDPC code defined by a parity check matrix expanded from a base matrix $B_{3/4}$, the LDPC code of the rate 4/5 is a code equivalent to a rate-4/5 LDPC code defined by a parity check matrix expanded from a base matrix $B_{4/5}$, the LDPC code of the rate 5/6 is a code equivalent to a rate-5/6 LDPC code defined by a parity check matrix expanded from a base matrix $B_{5/6}$, the LDPC code of the rate 13/15 is a code equivalent to a rate-13/15 LDPC code defined by a parity check matrix expanded from a base matrix $B_{13/15}$, and the LDPC code of the rate 9/10 is a code equivalent to a rate-9/10 LDPC code defined by a parity check matrix expanded from a base matrix $B_{9/10}$.

4. A digital communications receiver employing an LDPC decoder for decoding one or more LDPC codes selected from rates including 1/4, 2/5, 1/2, 3/5, 2/3, 3/4, 4/5, 5/6, 13/15, 9/10, wherein the LDPC code with the rate 1/4 has a bit node degree distribution $(b_2, b_3, b_6) = (11264, 256, 3840)$, the LDPC code with the rate 2/5 has a bit node degree distribution $(b_2, b_3, b_4, b_{12}) = (8960, 256, 4608, 1536)$, the LDPC code with the rate 1/2 has a bit node degree distribution $(b_2, b_3, b_4, b_{12}) = (7424, 2304, 3840, 1792)$, the LDPC code with the rate 3/5 has a bit node degree distribution $(b_2, b_3, b_4, b_{12}) = (5888, 3328, 4352, 1792)$, the LDPC code with the rate 2/3 has a bit node degree distribution $(b_2, b_3, b_4, b_{12}) = (4864, 4096, 4864, 1536)$, the LDPC code with the rate 3/4 has a bit node degree distribution $(b_2, b_3, b_4, b_{12}) = (3584, 4608, 5888, 1280)$, the LDPC code with the rate 4/5 has a bit node degree distribution $(b_2, b_3, b_4, b_{12}) = (2816, 5888, 5376, 1280)$, the LDPC code with the rate 5/6 has a bit node degree distribution $(b_2, b_3, b_4, b_{10}) = (2304, 4608, 6912, 1536)$, the LDPC code with the rate 13/15 has a bit node degree distribution $(b_2, b_3, b_4, b_7) = (1792, 5632, 6912, 1024)$, and the LDPC code with the rate 9/10 has a bit node degree distribution $(b_2, b_3, b_4) = (1280, 3584, 10496)$.

5. A digital communications receiver employing an LDPC decoder for decoding one or more LDPC codes selected from rates including 1/4, 2/5, 1/2, 3/5, 2/3, 3/4, 4/5, 5/6, 13/15, 9/10, wherein the LDPC code of the rate 1/4 is a rate-1/4 LDPC code defined by a parity check matrix expanded from a base matrix $B_{1/4}$, the LDPC code of the rate 2/5 is a rate-2/5 LDPC code defined by a parity check matrix expanded from a base matrix $B_{2/5}$, the LDPC code of the rate 1/2 is a rate-1/2 LDPC code defined by a parity check matrix expanded from a base matrix $B_{1/2}$, the LDPC code of the rate 3/5 is a rate-3/5 LDPC code defined by a parity check matrix expanded from a base matrix $B_{3/5}$, the LDPC code of the rate 2/3 is a rate-2/3 LDPC code defined by a parity check matrix expanded from a base matrix $B_{2/3}$, the LDPC code of the rate 3/4 is a rate-3/4 LDPC code defined by a parity check matrix expanded from a base matrix $B_{3/4}$, the LDPC code of the rate 4/5 is a rate-4/5 LDPC code defined by a parity check matrix expanded from a base matrix $B_{4/5}$, the LDPC code of the rate 5/6 is a rate-5/6 LDPC code defined by a parity check matrix expanded from a base matrix $B_{5/6}$, the LDPC code of the rate 13/15 is a rate-13/15 LDPC code defined by a parity check matrix expanded from a base matrix $B_{13/15}$, and the LDPC code of the rate 9/10 is a rate-9/10 LDPC code defined by a parity check matrix expanded from a base matrix $B_{9/10}$.

6. A digital communications receiver employing an LDPC decoder for decoding one or more LDPC codes selected from rates including 1/4, 2/5, 1/2, 3/5, 2/3, 3/4, 4/5, 5/6, 13/15, 9/10, wherein the LDPC code of the rate 1/4 is a code equivalent to a rate-1/4 LDPC code defined by a parity check matrix expanded from a base matrix $B_{1/4}$, the LDPC code of the rate 2/5 is a code equivalent to a rate-2/5 LDPC code defined by a parity check matrix expanded from a base matrix $B_{2/5}$, the LDPC code of the rate 1/2 is a code equivalent to a rate-1/2 LDPC code defined by a parity check matrix expanded from a base matrix $B_{1/2}$, the LDPC code of the rate 3/5 is a code equivalent to a rate-3/5 LDPC code defined by a parity check matrix expanded from a base matrix $B_{3/5}$, the LDPC code of the rate 2/3 is a code equivalent to a rate-2/3 LDPC code defined by a parity check matrix expanded from a base matrix $B_{2/3}$, the LDPC code of the rate 3/4 is a code equivalent to a rate-3/4 LDPC code defined by a parity check matrix expanded from a base matrix $B_{3/4}$, the LDPC code of the rate 4/5 is a code equivalent to a rate-4/5 LDPC code defined by a parity check matrix expanded from a base matrix $B_{4/5}$, the LDPC code of the rate 5/6 is a code equivalent to a rate-5/6 LDPC code defined by a parity check matrix expanded from a base matrix $B_{5/6}$, the LDPC code of the rate 13/15 is a code equivalent to a rate-13/15 LDPC code defined by a parity check matrix expanded from a base matrix $B_{13/15}$, and the LDPC code of the rate 9/10 is a code equivalent to a rate-9/10 LDPC code defined by a parity check matrix expanded from a base matrix $B_{9/10}$.

7. A non-transitory computer readable medium storing a computer program, the program when executed by a computer comprising generating one or more LDPC codes selected from rates including 1/4, 2/5, 1/2, 3/5, 2/3, 3/4, 4/5, 5/6, 13/15, 9/10, wherein the LDPC code with the rate 1/4 has a bit node degree distribution $(b_2, b_3, b_6) = (11264, 256, 3840)$, the LDPC code with the rate 2/5 has a bit node degree distribution $(b_2, b_3, b_4, b_{12}) = (8960, 256, 4608, 1536)$, the LDPC code with the rate 1/2 has a bit node degree distribution $(b_2, b_3, b_4, b_{12}) = (7424, 2304, 3840, 1792)$, the LDPC code with the rate 3/5 has a bit node degree distribution $(b_2, b_3, b_4, b_{12}) = (5888, 3328, 4352, 1792)$, the LDPC code with the rate 2/3 has a bit node degree distribution $(b_2, b_3, b_4, b_{12}) = (4864, 4096, 4864, 1536)$, the LDPC code with the rate 3/4 has a bit node degree distribution $(b_2,b_3,b_4,b_{12})$=(3584,4608,5888,1280), the LDPC code with the rate 4/5 has a bit node degree distribution $(b_2,b_3,b_4,b_{12})$=(2816,5888,5376,1280), the LDPC code with the rate 5/6 has a bit node degree distribution $(b_2,b_3,b_4,b10)$=(2304,4608,6912,1536), the LDPC code with the rate 13/15 has a bit node degree distribution $(b_2,b_3,b_4,b_7)$=(1792,5632,6912,1024), and LDPC code with the rate 9/10 has a bit node degree distribution $(b_2,b_3,b_4)$=(1280,3584,10496).

8. A non-transitory computer readable medium storing a computer program, the program when executed by a computer comprising generating one or more LDPC codes selected from rates including 1/4, 2/5, 1/2, 3/5, 2/3, 3/4, 4/5, 5/6, 13/15, 9/10, wherein the LDPC code of the rate 1/4 is a rate-1/4 LDPC code defined by a parity check matrix expanded from a base matrix $B_{1/4}$, the LDPC code of the rate 2/5 is a rate-2/5 LDPC code defined by a parity check matrix expanded from a base matrix $B_{2/5}$, the LDPC code of the rate 1/2 is a rate-1/2 LDPC code defined by a parity check matrix expanded from a base matrix $B_{1/2}$, the LDPC code of the rate 3/5 is a rate-3/5 LDPC code defined by a parity check matrix expanded from a base matrix $B_{3/5}$, the LDPC code of the rate 2/3 is a rate-2/3 LDPC code defined by a parity check matrix expanded from a base matrix $B_{2/3}$, the LDPC code of the rate 3/4 is a rate-3/4 LDPC code defined by a parity check matrix expanded from a base matrix $B_{3/4}$, the LDPC code of the rate 4/5 is a rate-4/5 LDPC code defined by a parity check matrix expanded from a base matrix $B_{4/5}$, the LDPC code of the rate 5/6 is a rate-5/6 LDPC code defined by a parity check matrix expanded from a base matrix $B_{5/6}$, the LDPC code of the rate 13/15 is a rate-13/15 LDPC code defined by a parity check matrix expanded from a base matrix $B_{13/15}$, and the LDPC code of the rate 9/10 is a rate-9/10 LDPC code defined by a parity check matrix expanded from a base matrix $B_{9/10}$.

9. A non-transitory computer readable medium storing a computer program, the program when executed by a computer comprising generating one or more LDPC codes selected from rates including 1/4, 2/5, 1/2, 3/5, 2/3, 3/4, 4/5, 5/6, 13/15, 9/10, wherein the LDPC code of the rate 1/4 is a code equivalent to a rate-1/4 LDPC code defined by a parity check matrix expanded from a base matrix $B_{1/4}$, the LDPC code of the rate 2/5 is a code equivalent to a rate-2/5 LDPC code defined by a parity check matrix expanded from a base matrix $B_{2/5}$, the LDPC code of the rate 1/2 is a code equivalent to a rate-1/2 LDPC code defined by a parity check matrix expanded from a base matrix $B_{1/2}$, the LDPC code of the rate 3/5 is a code equivalent to a rate-3/5 LDPC code defined by a parity check matrix expanded from a base matrix $B_{3/5}$, the LDPC code of the rate 2/3 is a code equivalent to a rate-2/3 LDPC code defined by a parity check matrix expanded from a base matrix $B_{2/3}$, the LDPC code of the rate 3/4 is a code equivalent to a rate-3/4 LDPC code defined by a parity check matrix expanded from a base matrix $B_{3/4}$, the LDPC code of the rate 4/5 is a code equivalent to a rate-4/5 LDPC code defined by a parity check matrix expanded from a base matrix $B_{4/5}$, the LDPC code of the rate 5/6 is a code equivalent to a rate-5/6 LDPC code defined by a parity check matrix expanded from a base matrix $B_{5/6}$, the LDPC code of the rate 13/15 is a code equivalent to a rate-13/15 LDPC code defined by a parity check matrix expanded from a base matrix $B_{13/15}$, and the LDPC code of the rate 9/10 is a code equivalent to a rate-9/10 LDPC code defined by a parity check matrix expanded from a base matrix $B_{9/10}$.

* * * * *